(12) United States Patent
Stevens et al.

(10) Patent No.: US 10,033,165 B2
(45) Date of Patent: Jul. 24, 2018

(54) CIRCUIT BREAKER RESET FOR POWER DISTRIBUTION UNITS

(71) Applicant: HEWLETT PACKARD ENTERPRISE DEVELOPMENT LP, Houston, TX (US)

(72) Inventors: Matthew E Stevens, Houston, TX (US); Chris F Felcman, Magnolia, TX (US); Royal H King, Magnolia, TX (US)

(73) Assignee: HEWLATT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 15/283,275

(22) Filed: Sep. 30, 2016

(65) Prior Publication Data

US 2018/0097342 A1    Apr. 5, 2018

(51) Int. Cl.
*H02B 1/26* (2006.01)
*H02B 1/34* (2006.01)
*H02B 1/052* (2006.01)
*H05K 7/14* (2006.01)

(52) U.S. Cl.
CPC .............. *H02B 1/34* (2013.01); *H02B 1/052* (2013.01); *H05K 7/1492* (2013.01)

(58) Field of Classification Search
None
See application file for complete search history.

(56) References Cited

U.S. PATENT DOCUMENTS

| 9,727,100 | B1* | 8/2017 | Eaton | G06F 1/189 |
| 2009/0236909 | A1* | 9/2009 | Aldag | H01R 25/142 307/39 |
| 2013/0196535 | A1* | 8/2013 | Utz | H01R 23/6866 439/536 |
| 2015/0056853 | A1* | 2/2015 | Utz | H01R 23/6866 439/536 |
| 2016/0351358 | A1* | 12/2016 | Stewart | H05K 7/18 |
| 2016/0351359 | A1* | 12/2016 | Sampath | H05K 7/18 |
| 2017/0042030 | A1* | 2/2017 | Utz | H05K 3/325 |

* cited by examiner

*Primary Examiner* — Courtney Smith
(74) *Attorney, Agent, or Firm* — Hewlett Packard Enterprise Patent Department

(57) ABSTRACT

Examples described herein relate to circuit breaker reset for power distribution units (PDUs). In one example, an apparatus to reset a circuit breaker of a PDU includes a bracket to enclose a portion of a rack rail, where one end of the bracket is coupled to a surface of the PDU including the circuit breaker. The apparatus also includes an elongated member disposed within the bracket, the elongated member includes a distal end to make contact with the circuit breaker, when force is applied to a proximal end of the elongated member, to reset the circuit breaker.

11 Claims, 5 Drawing Sheets

CIRCUIT BREAKER RESET FOR POWER DISTRIBUTION UNITS

BACKGROUND

Computing centers such as data centers generally include a large number of electronic devices. The electronic devices can be servers, switches, routers, storage systems, and the like. A rack may provide a standardized structure to support and mount the electronic devices. A power distribution unit (PDU) can also be mounted on the rack to provide electrical power to the electronic devices via a number of power receptacles on a surface of the PDU.

BRIEF DESCRIPTION OF THE DRAWINGS

Some examples of the present application are described with respect to the following figures.

DETAILED DESCRIPTION

Figure 1:
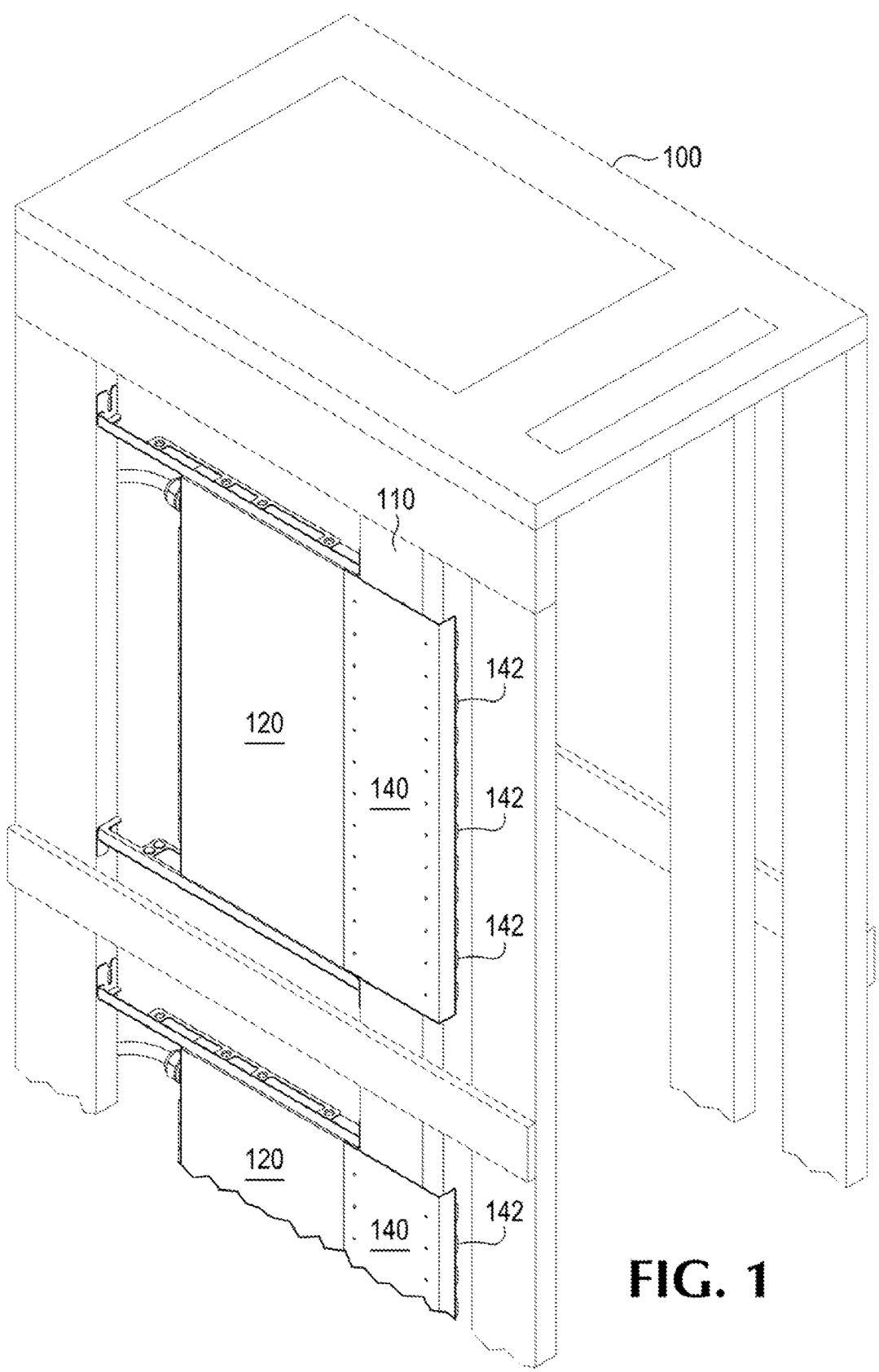
FIG. 1 is a perspective view of an apparatus to reset a circuit breaker of a power distribution unit (PDU), according to an example.

Examples described herein relate to circuit breaker reset for power distribution units (PDUs). A PDU can be rack mounted to provide power to a plurality of rack mount electronic devices (e.g., server devices, networking devices, storage devices, switches, etc.) by coupling the power cords of the electronic devices to the power receptacles (power outlets or power connectors) of the PDU. The PDU can include circuitry and software or firmware to convert alternating current (AC) power to direct current (DC) power for the electronic devices. Further, the PDU can include a circuit breaker, for the power receptacles, to protect the electronic devices from damages that may be caused by overload or short circuit by interrupting flow to the electronic devices.

As used herein, a circuit breaker can be a branch rated circuit protection device. A branch rated circuit protection device is a device such as a fuse or a circuit breaker that has been evaluated to a safety standard for providing overcurrent protection. Overcurrent (or excess current) is a situation where a larger than intended electric current exists through a conductor, leading to excessive generation of heat, and the risk of fire or damage to equipment. A branch circuit refers to conductors and components following the last overcurrent protective device protecting a load, and a branch circuit protection refers to overcurrent protection with an ampere rating selected to protect the branch circuit. A circuit breaker refers to a device designed to open and close a circuit by non-automatic means, and to open the circuit automatically on a pre-determined overcurrent, without damage to itself when properly applied within its rating. A fuse refers to a type of low resistance resistor that acts as a sacrificial device to provide overcurrent protection, of either the load or source circuit by interrupting an excessive current.

Certain types of PDUs can be mounted between rack rails. A rack rail can be a standard rack rail such as the Radio Electronics Television Manufacturers' Association (RETMA) rail. Accessibility to circuit breakers for PDUs mounted between rack rails may be problematic, for example, when the circuit breakers trip. This problem is further magnified in environments where racks are bayed together, for example in a data center. To illustrate, if a circuit breaker is tripped (i.e., open), it may be difficult to access the tripped circuit breaker to reset it when the PDU is side mounted on the rack (i.e., mounted between rack rails) or when the rack is bayed together with another rack. If the rack is bayed together, for example, a user may have to un-bay the rack and move it out from the row of racks to access the tripped circuit breaker. In some instances, the user may have to unplug the PDU power cord from the data center power receptacle to be able to move the rack out from the row of racks due to cord length limitation on the PDU. In such instances, unplugging the PDU power cord would be disruptive because electronic devices plugged to the PDU would be powered down including the electronic device associated with the tripped circuit breaker.

The describe examples address the above challenges by providing easy access to reset circuit breakers on PDUs mounted between rack rails while maintaining or providing power receptacle density. The described circuit breaker reset mechanism fits around a rack rail and provides access to reset a circuit breaker that has tripped. The mechanism resets the circuit breaker that has been tripped (i.e., opened) while preventing accidental tripping of the circuit breaker by the mechanism. Further, the described mechanism include spring members that maintain a distance between the mechanism and the circuit breakers to prevent interference with the circuit breaker's ability to be tripped or opened.

In one example, an apparatus to reset a circuit breaker of a power distribution unit (PDU) includes a bracket to enclose a portion of a rack rail, where one end of the bracket is coupled to a surface of the PDU including the circuit breaker. The apparatus also includes an elongated member disposed within the bracket, the elongated member includes a distal end to make contact with the circuit breaker, when force is applied to a proximal end of the elongated member, to reset the circuit breaker.

In another example, a system includes a power distribution unit (PDU) and a circuit breaker reset member. The PDU includes a plurality of power receptacles on a front side of the PDU to distribute power to a plurality of electronic devices coupled to the PDU, and a plurality of circuit breakers on a back surface of the PDU, the plurality of circuit breakers corresponding to the plurality of power receptacles, where the PDU is mounted on a rack rail. The circuit breaker reset member includes a bracket to enclose a portion of the rack rail, the bracket including a first end coupled to the back surface of the PDU and a second end coupled to the rack rail. The circuit breaker reset member also includes a plurality of slide rails disposed within an inner portion of the bracket, each slide rail corresponding to a circuit breaker and each slide rail including a distal end and a proximal end, the distal end to make contact with respective circuit breakers when force is applied to the proximal end, to reset the respective circuit breakers.

Referring now to the figures, FIG. 1 is a perspective view of an apparatus to reset a circuit breaker of a power distribution unit (PDU), according to an example. PDU 120 can be mounted between rack rails 110 of the rack 100. In such a mounting scheme, PDU 120 can be said to be side-mounted to the rack 100. Accordingly, a front surface of the PDU 120 that includes a plurality of power receptacles is facing a front of the rack 100 and a back surface of the PDU 120 that includes a plurality of circuit breakers is facing a rear of the rack 100. It should be noted that multiple PDUs 120 can be mounted between the rails 110 of the rack 100. Rail 110 can be a RETMA rail or any other industry standard rack rail.

Circuit breaker reset member 140 can be attached to the rail 110 and to the back surface of the PDU 120. Circuit breaker reset member 140 includes a bracket and an elongated member 142 disposed within the bracket. In some examples, the bracket can enclose a portion of the rack rail 110. In such examples, one end of the bracket can be attached to the back surface of the PDU 120 (i.e., where the circuit breakers are located), and a second end of the bracket can be attached to the rack rail 110. The elongated member 142 disposed within the bracket includes a distal end that makes contact with the circuit breaker, when a force is applied to a proximal end of the elongated member 142, to reset the circuit breaker. As used herein, the distal end is the portion of the elongated member that makes contact with the surface of the PDU 110 (and the circuit breaker), and is further from the reach of the user, and the proximal end is the portion of the elongated member 142 that includes a surface that the user can apply force to or push, to reset the circuit breaker.

In some examples, the elongated member is a slide rail that moves in a horizontal direction towards the circuit breaker (i.e., to depress the circuit breaker), when pushed (i.e., applied force) at the proximal end. The elongated member 142 is configured to extend horizontally beyond the bracket to provide a surface for applying force. Accordingly, when a circuit breaker trips, the circuit breaker can be easily reset by applying force (i.e., pushing) on the proximal end of the elongated member 142 of the circuit breaker reset member 140, from a rear of the rack. It should be noted that multiple elongated members 142 can be disposed within the bracket, each elongated member 142 corresponding to a circuit breaker on the back surface of the PDU 120.

Figure 2:
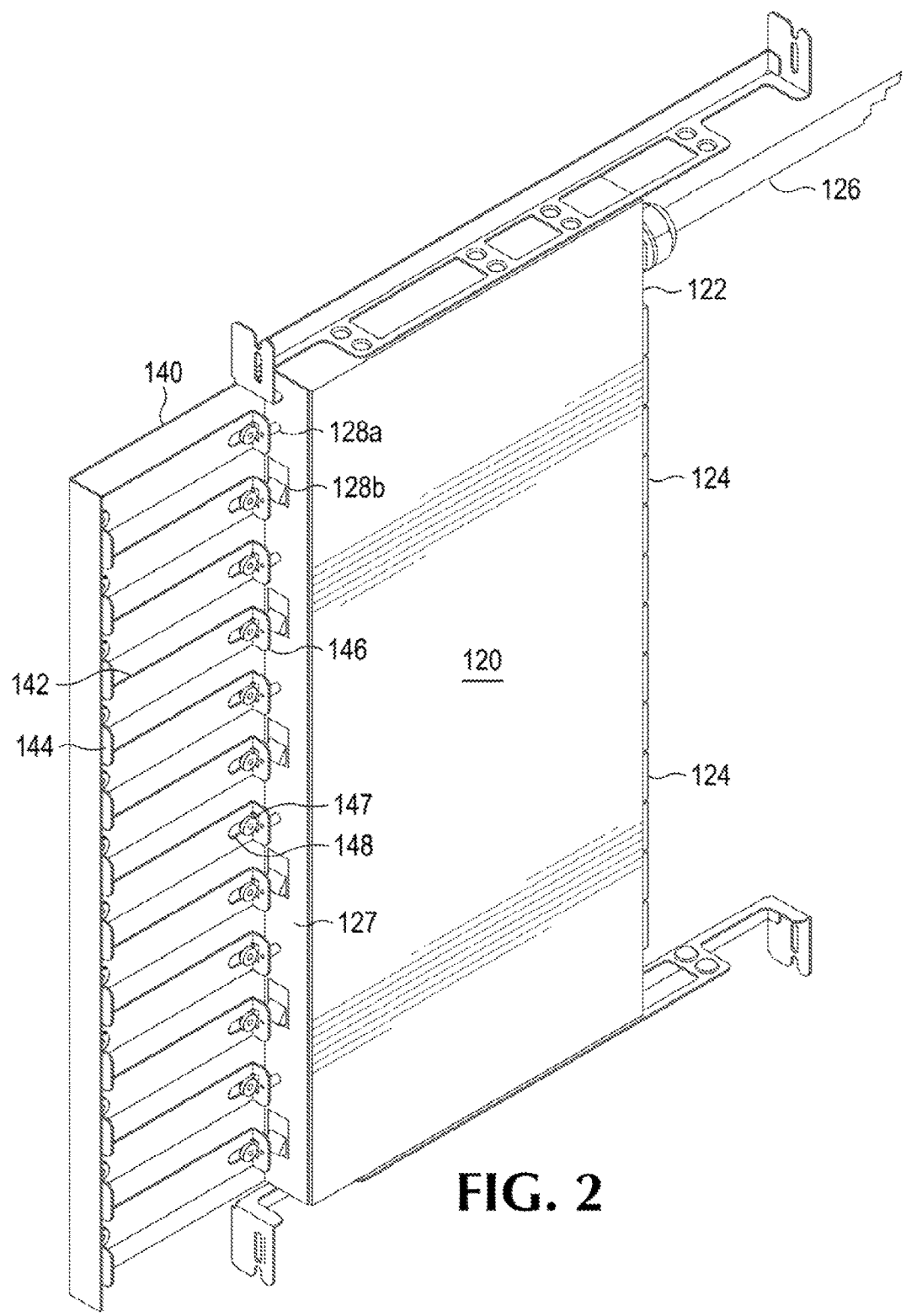
FIG. 2 is a perspective view of the apparatus including a bracket and an elongated member disposed within the bracket to reset a circuit breaker of the PDU, according to an example.

FIG. 2 is a perspective view of the apparatus including a bracket and an elongated member disposed within the bracket to reset a circuit breaker of the PDU, according to an example. PDU 120 includes a front surface 122 and a back surface 127. Front surface 122 includes the plurality of power receptacles 124 to removably plug in power cords of electronic devices to the PDU 120 such that the PDU 120 can provide power to the electronic devices (e.g., servers, networking devices, storage devices, switches, etc.). Receptacles 124 can be any standard power outlet for receiving standard plugs. For example, in a server rack or data center power system, receptacles 124 can be International Electrotechnical Commission (IEC) standard C19 or C13 outlets configured to receive a standard C14 or C20 plugs. The number of receptacles 124 on the front surface 122 of the PDU 120 can vary.

The front surface 122 of the PDU 120 can also include a power cord 126 (or terminal block) for providing power to the PDU 120. For example, PDU 120 can be coupled to a main power supply or to a backup power supply, such as an uninterruptible power supply (UPS), via the power cord 126. As used herein, a terminal block (or terminal board or strip) provides a convenient means of connecting individual electrical wires without a splice or physically joining ends, and may be used to connect wiring among various items of equipment within an enclosure or to make connections among individually enclosed items.

Back surface 127 includes a plurality of circuit breakers 128 corresponding to the receptacles 124. In some examples, receptacles 124 can include a number of sets or groups of receptacles such that each set or group of receptacles 124 is associated with a circuit breaker 128. Circuit breakers 128 can be different types. For example, one circuit breaker 128 can be a push-rod circuit breaker 128*a* and another circuit breaker 128 can be a switch-type circuit breaker 128*b*. Circuit breakers 128 can provide overcurrent protection to the loads (i.e., electronic devices) coupled to the receptacles 125.

Circuit breaker reset member 140 can be attached to the rail 110 of the rack 100 and to the back surface 127 of the PDU 120. Circuit breaker reset member 140 can be in the form of a bracket (e.g., a mounting bracket), and includes a number of elongated members 142 disposed within (or attached) to the circuit breaker reset member 140. In some examples, circuit breaker reset member 140 includes a base plate and a sidewall extending upwards from each end of the base plate such that the base plate and the sidewalls define a cavity for receiving the elongated members 142. Elongated members 142 can include a distal end 146 that makes contact with the circuit breakers 128, and a proximal end 144 for applying the force required to reset the circuit breakers 128.

In some examples, the elongated members 142 are similarly shaped like the circuit breaker reset member 140 (i.e., a base plate with sidewalls extending upwards from each end of the base plate such that the base plate and the sidewalls define a cavity). In certain examples, the elongated members 142 are slide rails that move in a horizontal manner towards the circuit breakers 128 when a force is applied at the proximal end 144. Elongated members 142 include cutout portions 147 at each of the proximal end 144 and the distal end 146 (e.g., within the baseplate of the elongated members 142). The cutout portions 147 work in tandem with the attachment pins/buttons 147 to limit motion of the elongated members 142 along the horizontal direction. Attachment buttons 147 are also used for securing the elongated members 142 to the circuit breaker reset member 140 and to the rail 110. When a force is applied to the proximal end 144 of the elongated member 142 moves horizontally a distance until stopped by the attachment buttons 147 within the cutout regions 148.

In some examples, PDU 120 includes a plurality of visual indicators (not shown) to align the receptacles 124 to the circuit breakers 128. Visual indicators can include a number of different visual indicators to align a particular group or set of receptacles 124 to a corresponding circuit breaker 128. For example, a silkscreen labeling could be provided on a circuit breaker 128 could correlate with a corresponding load segment (i.e., receptacles 128).

Figure 3:
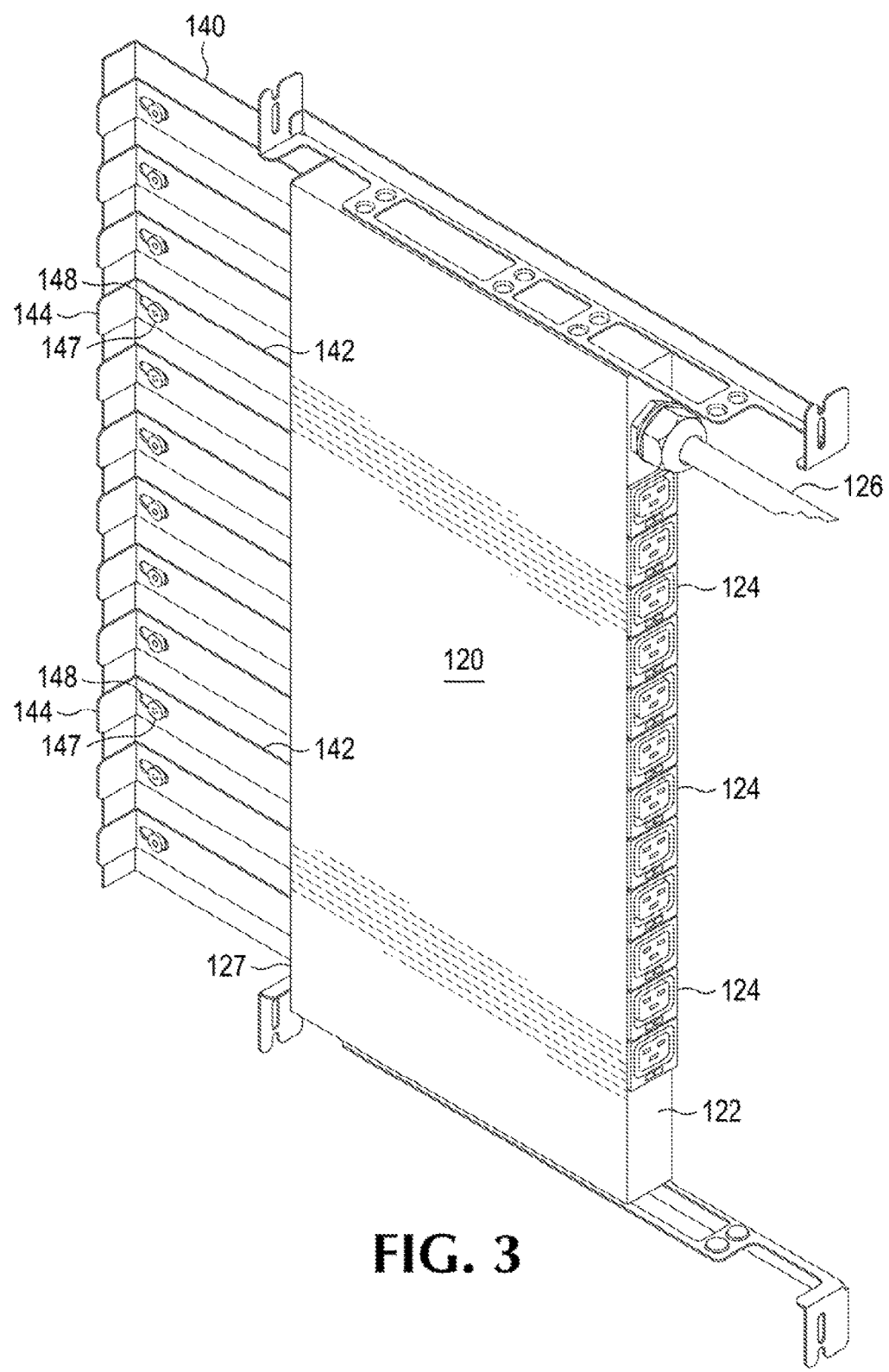
FIG. 3 is a perspective view of the apparatus including a bracket and an elongated member disposed within the bracket to reset a circuit breaker of the PDU, according to another example.

FIG. 3 is a perspective view of the apparatus including a bracket and an elongated member disposed within the bracket to reset a circuit breaker of the PDU, according to another example. The example of FIG. 3 shows the front surface 122 of the PDU 120. The front surface 122 includes the plurality of receptacles 124 and the power cord 126 for providing power to the PDU 120. The back surface 127 of the PDU 120 includes the circuit breakers 128 associated with the receptacles 124. One end of the circuit breaker reset member 140 is attached to the back surface 127 of the PDU 120. The circuit breaker reset member 140 (or bracket)

houses the plurality of elongated members 142 (or sliding rail) that provide a means to reset the circuit breakers 128 by applying a force on the proximal ends 144 of the elongated members 142 which in turn causes the distal ends 146 of the elongated member 142 to depress the circuit breakers 128, to reset the circuit breakers. In some examples, the proximal end 144 of the elongated member 142 extends horizontally beyond the circuit breaker reset member to provide a surface for applying force onto the elongated member 142.

Figure 4:
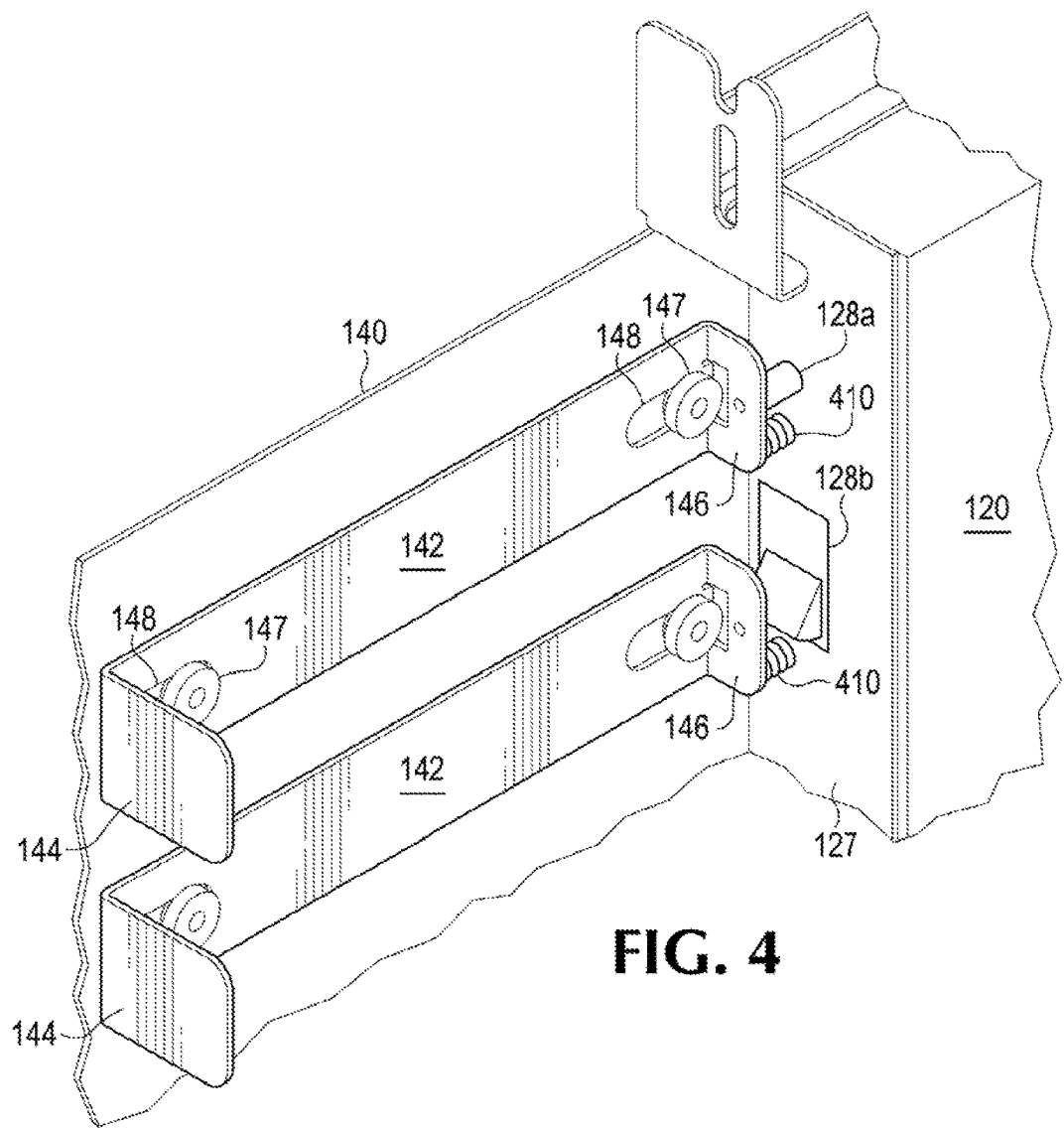
FIG. 4 is a perspective view of the apparatus including a bracket and an elongated member disposed within the bracket to reset a circuit breaker of the PDU, according to another example.

FIG. 4 is a perspective view of the apparatus including a bracket and an elongated member disposed within the bracket to reset a circuit breaker of the PDU, according to another example. Circuit breaker reset member 140 can also include spring members 410 disposed between the distal end 146 of the elongated members 142 and the back surface 127 of the PDU 120. Spring member 410 maintains a minimum distance between the distal end 146 of the elongated member 142 and the back surface 127 of the PDU 120 to enable the circuit breaker 128 to trip without interference by the elongated member 142. For example, in a switch-type circuit breaker 128b, the circuit breaker 128b can move/trip (e.g., flip out) without resistance from the elongated member 142. Similarly, in a push-rod type circuit breaker 128a, the circuit breaker 128a can pop-out without resistance from the elongated member 142.

Figure 5:
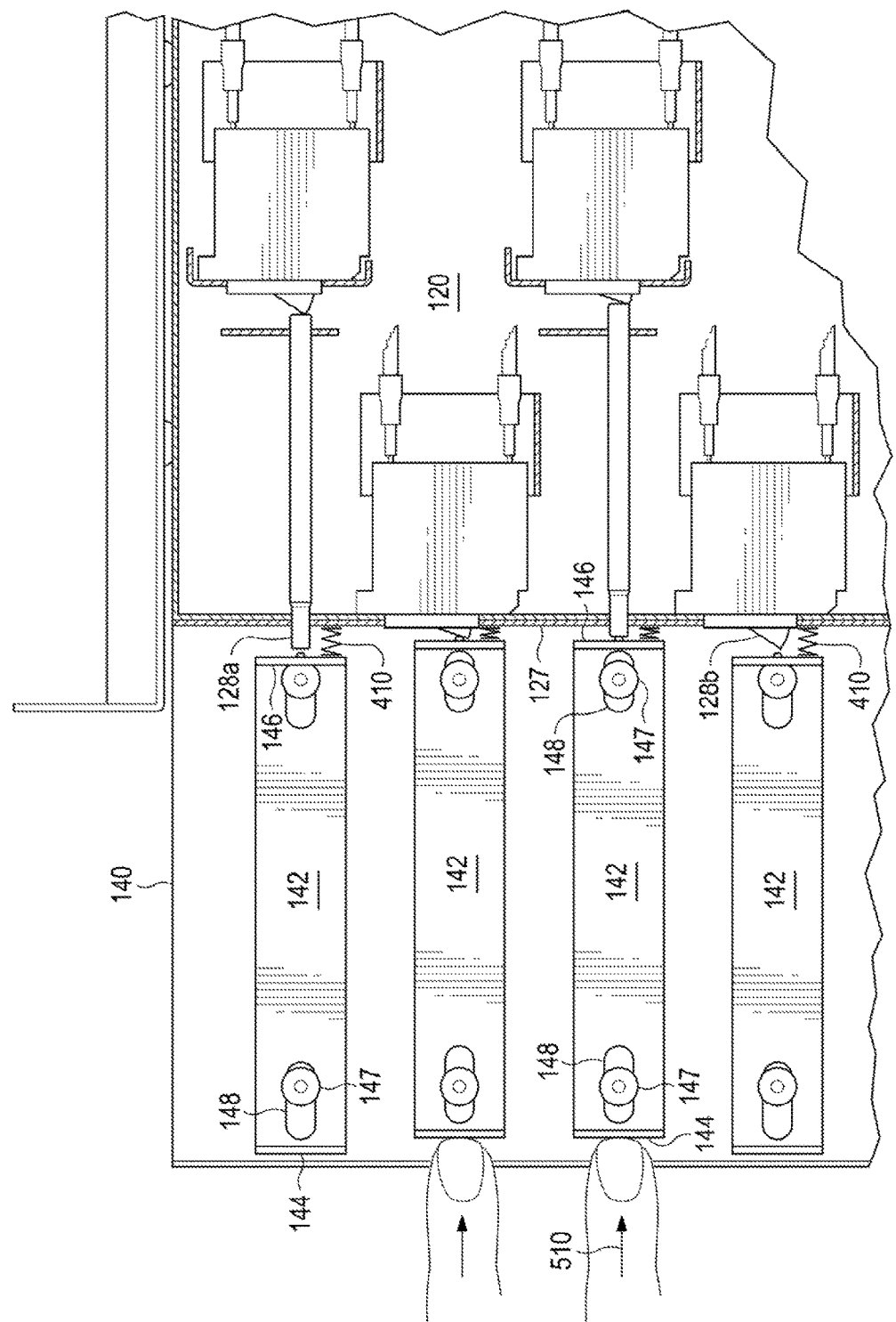
FIG. 5 is a cross-sectional view of the apparatus including a bracket and an elongated member disposed within the bracket and a force applied to the elongated member to reset a circuit breaker of the PDU, according to an example.

FIG. 5 is a cross-sectional view of the apparatus including a bracket and an elongated member disposed within the bracket and a force applied to the elongated member to reset a circuit breaker of the PDU, according to an example. The example of FIG. 5 shows a force 510 applied (by a user) on the proximal end 144 of the elongated member 142 to cause the elongated member 142 to slide horizontally such that the distal end 146 can depress the circuit breaker 128 to reset the circuit breaker. As described above, the proximal end 144 of the elongated member extends substantially horizontally beyond the circuit breaker reset member 140 to provide sufficient surface on the elongated member 142 to apply the force 510.

In the foregoing description, numerous details are set forth to provide an understanding of the subject matter disclosed herein. However, implementation may be practiced without some or all of these details. Other implementations may include modifications and variations from the details discussed above. It is intended that the following claims cover such modifications and variations.

What is claimed is:

1. A system, comprising:
   a power distribution unit (PDU), the PDU comprising:
      a plurality of power receptacles on a front surface of the PDU to distribute power to a plurality of electronic devices coupled to the PDU; and
      a plurality of circuit breakers on an external back surface of the PDU, the plurality of circuit breakers corresponding to the plurality of power receptacles, wherein the PDU is mounted on a respective one of rack rails; and
   a circuit breaker reset member, comprising:
      a bracket to enclose a portion of the rack rail, the bracket comprising a first end coupled to the back surface of the PDU and a second end coupled to the rack rail; and
      a plurality of slide rails disposed within an inner portion of the bracket, each slide rail corresponding to the respective circuit breakers and each slide rail including a distal end and a proximal end, the distal end to make contact with the respective circuit breakers when force is applied to the proximal end, to reset the respective circuit breakers.

2. The system of claim 1, the circuit breaker reset member comprising:
   attachment pins for the slide rails to attach the slide rails to the circuit breaker reset member; and
   cutout portions at the distal and proximal ends of the slide rails to receive the attachment pins and to limit motion of the slide rails in a horizontal direction when force is applied to the proximal ends of the slide rails.

3. The system of claim 2, wherein the attachment pins limit a sliding motion of the slide rails when the cutout portions are stopped by the attachment pins within the cutout portions.

4. The system of claim 1, the circuit breaker reset member comprising a plurality of spring members, a spring member disposed between the distal end of each slide rail and the back surface of the PDU, wherein each spring member maintains a minimum distance between the distal end and the back surface of the PDU to enable the circuit breakers to be tripped without interference by the slide rails.

5. The system of claim 1, wherein the proximal end of each slide rail extends horizontally beyond the bracket to enable access to the proximal ends of the slide rails to apply necessary force to reset the circuit breakers.

6. The system of claim 1, wherein the plurality of receptacles comprise a number of groups of receptacles, wherein each group of receptacles is associated with a circuit breaker of the plurality of circuit breakers.

7. The system of claim 6, the circuit breaker reset member comprising visual indicators to align a group of power receptacles to one of the corresponding circuit breakers.

8. The system of claim 1, wherein the plurality of receptacles comprise International Electrotechnical Commission (IEC) C13 or C19 receptacles.

9. The system of claim 1, wherein the PDU is mounted between the respective rack rails of a rack enclosure.

10. The system of claim 9, wherein the rack rails include Radio Electronics Television Manufacturers' Association (RETMA) standard rails.

11. The system of claim 1, wherein the plurality of circuit breakers include a switch based circuit breaker or a push-rod circuit breaker.

* * * * *